United States Patent
Abernethy

(10) Patent No.: US 8,558,575 B1
(45) Date of Patent: Oct. 15, 2013

(54) CLOCK GENERATION FOR N.5 MODULUS DIVIDER

(75) Inventor: Brian Abernethy, Escondido, CA (US)

(73) Assignee: APPLIED Micro Circuits Corporation, Sunnyvale, CA (US)

(*) Notice: Subject to any disclaimer, the term of this patent is extended or adjusted under 35 U.S.C. 154(b) by 20 days.

(21) Appl. No.: 13/427,955

(22) Filed: Mar. 23, 2012

(51) Int. Cl.
*H03K 19/21* (2006.01)

(52) U.S. Cl.
USPC ............ 326/52; 326/93; 327/115; 327/117; 327/170; 327/172; 327/291; 377/48

(58) Field of Classification Search
USPC ............ 326/52, 54–55, 93–98; 327/100, 115, 327/117, 144, 164, 170, 172, 178, 291; 377/47–48
See application file for complete search history.

(56) References Cited

U.S. PATENT DOCUMENTS

| 5,442,670 A * | 8/1995 | Shu .................................. 377/48 |
| 6,121,801 A * | 9/2000 | Lee ................................. 327/115 |
| 6,404,840 B1 * | 6/2002 | Sindalovsky ................... 377/48 |
| 2005/0088210 A1 * | 4/2005 | Chen ............................ 327/115 |
| 2012/0314833 A1 * | 12/2012 | Venkatasubramanian et al. .............................. 377/48 |

* cited by examiner

*Primary Examiner* — Jason M Crawford

(57) ABSTRACT

A system is provided for generating an output clock used for N.5 modulus division. An edge-slip circuit accepts a modulus count, a divisor select signal, and a clock signal having a frequency greater than a modulus count frequency. The edge-slip circuit also has an input to accept an output clock signal, and an output to supply a clock slip signal (NE). An exclusive-or (XOR) has an input to accept a buffered clock signal (NF) and the clock slip signal (NE). The XOR has an output to supply the output clock signal. The output clock signal has a frequency equal to a buffered clock signal frequency, with no skipped clock edges, when the clock slip signal does not change logic levels. Alternatively, the output clock signal frequency is equal to the buffered clock signal frequency, with a skipped clock edge, when the clock slip signal changes logic levels.

14 Claims, 7 Drawing Sheets

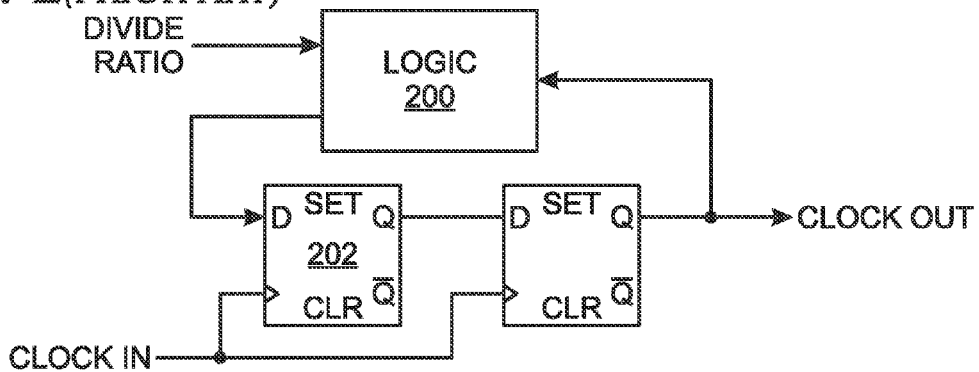
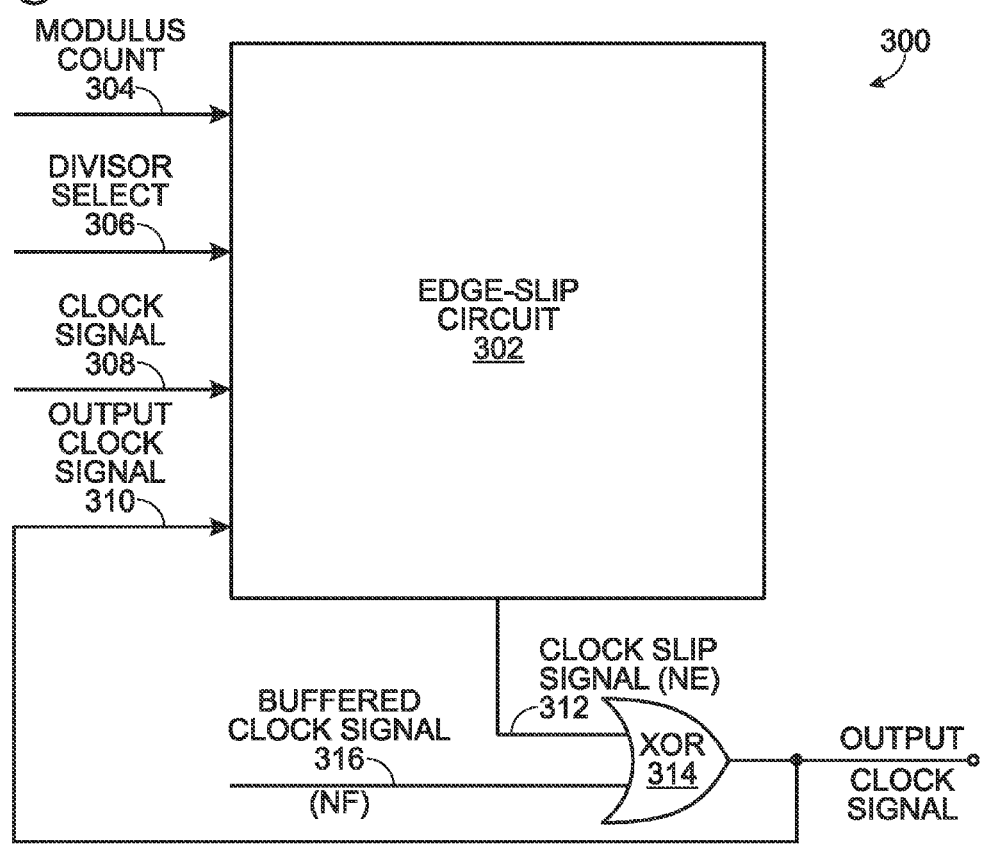

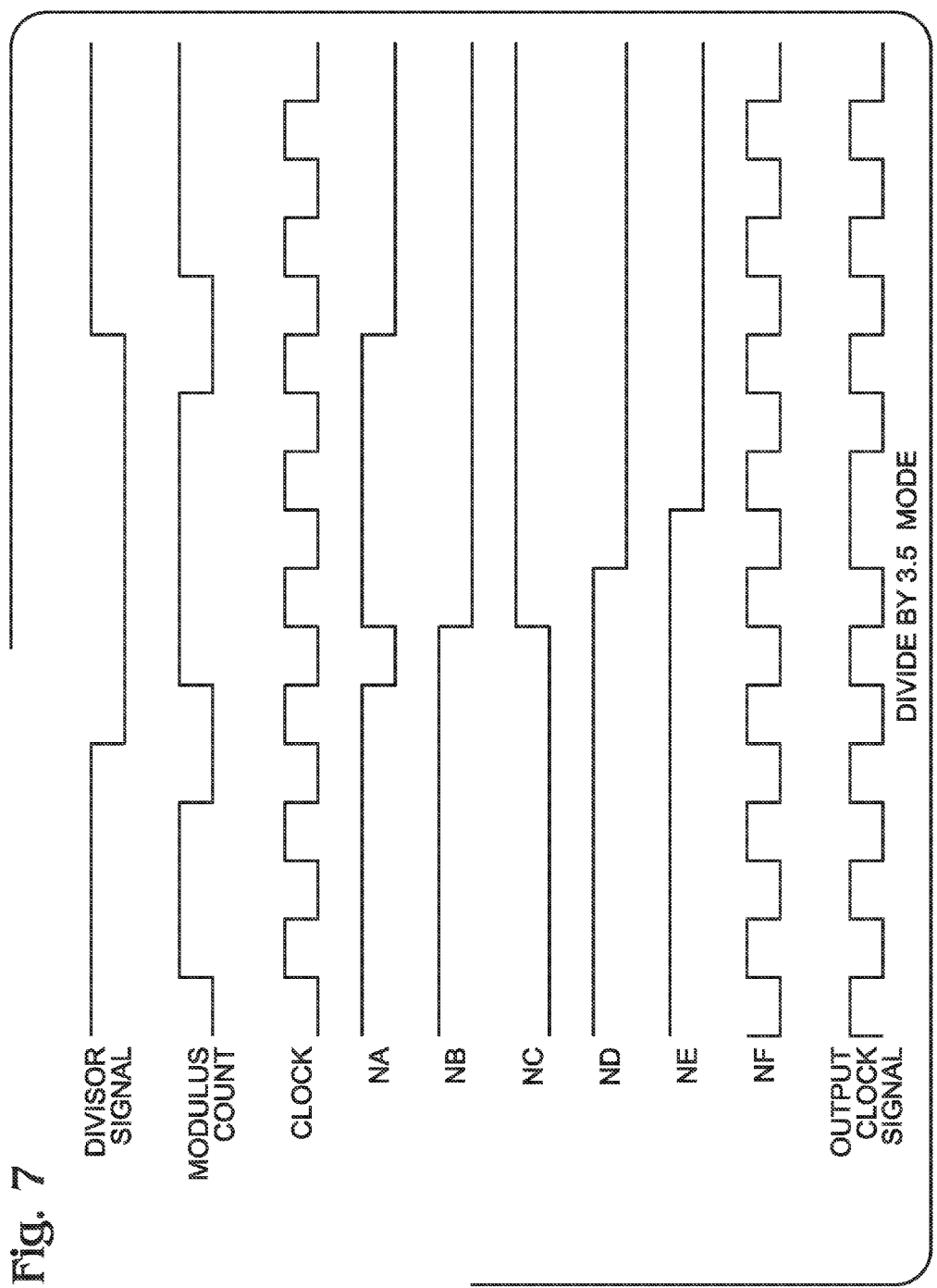

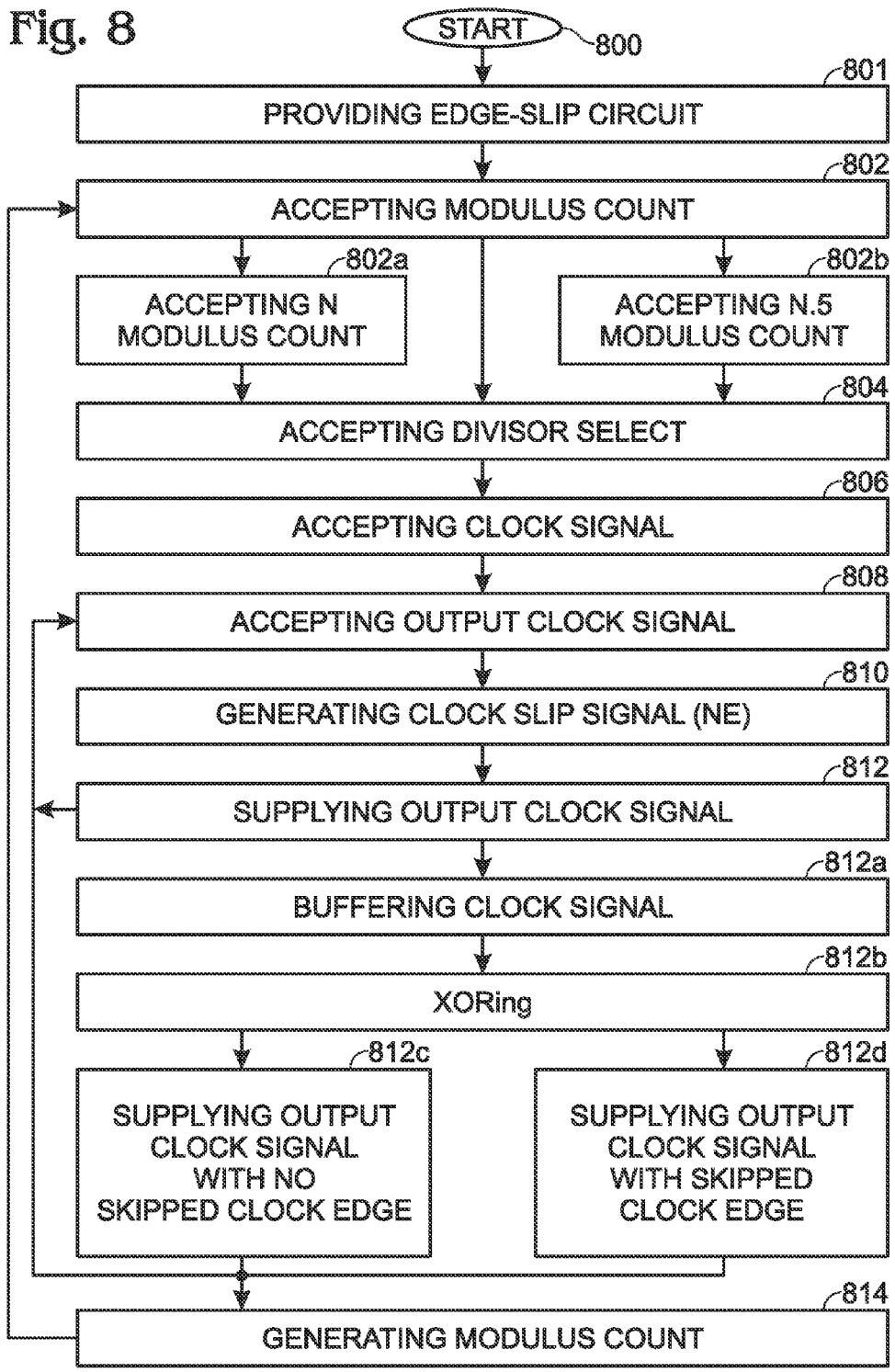

CLOCK GENERATION FOR N.5 MODULUS DIVIDER

BACKGROUND OF THE INVENTION

1. Field of the Invention

This invention generally relates to frequency synthesis and, more particularly, to a system and method for generating an N.5 divider, where N is an integer.

2. Description of the Related Art

Phase-Locked-Loop (PLL)—A circuit using a reference frequency and feedback to control a high frequency output signal.

Fractional-N—A circuit that varies the divide ratio of a divider between two or more integer values, allowing the overall average division ratio to be a fraction between the integer divide ratios.

Modulus Counter—A counter that can change its divide ratio on-the-fly. Normally, the counter is limited to a few values such as divide by (2 or 3) or divide by (4 or 5), etc.

Phase Frequency Detector—A circuit that outputs an analog voltage set by the phase and frequency of the two inputs, the reference clock and the PLL divider block. If the reference clock is faster in frequency or sooner in phase, the circuit outputs a positive voltage to speed up a voltage controlled oscillator (VCO). Should the PLL divider signal be faster in frequency or sooner in phase, then it output a negative signal slowing down the VCO.

Voltage Controlled Oscillator (VCO)—An oscillator with an output frequency that is controllable by an analog voltage input supplied by a phase frequency detector.

Delta Sigma—A circuit that provides dithering or a pseudo random variation in divide ratios to reduce spurs.

Spurs (spurious frequencies)—Undesired frequency components in the VCO's output signal due to the interaction of the reference frequency signal mixing with the counter output frequency.

FIG. 1 is a schematic diagram of a phase-locked loop (prior art). A modulus counter 100 divides the VCO 102 signal by N. Even if N is an integer, the delta sigma circuit 104 may cause the modulus counter to dither, creating an average divisor N. For example, the modulus counter may divide by (N+1) 50% of the time and (N—1) 50% of the time. In this example, counter 106 divides by integer M.

FIG. 2 is a schematic diagram of a simplified modulus counter, which divides by N in FIG. 1 (prior art). An input signal is applied to the logic block 200, which then monitors the clock out signal and inputs the proper signal to the first flip-flop 202. This circuit is a very simple example. Modulus dividers can consist of several flip-flops and can exist in chains of several individual modulus divider blocks. Existing modulus dividers are limited to divide by N ratios, hence are coarse in the divide ratios they can provide, resulting in high spurs and large voltage swings at the output of the phase detector.

It would be advantageous if a modulus counter had the added ability to divide by N.5, as well as N, adding the flexibility of a greater number divide ratios for use in a fractional-N PLL.

It would be advantageous if a divide by N.5 ratio could be added to a modulus counter, to reduce the amplitude of generated spurs by as much as 6 dB.

SUMMARY OF THE INVENTION

Accordingly, a system is provided for generating an output clock used for N.5 modulus division. The system comprises an edge-slip circuit having an input to accept a modulus count, an input to accept a divisor select signal, and an input to accept a clock signal having a frequency greater than a modulus count frequency. The edge-slip circuit also has an input to accept an output clock signal, and an output to supply a clock slip signal (NE). An exclusive-or (XOR) has an input to accept a buffered clock signal (NF) and the clock slip signal (NE). The XOR has an output to supply the output clock signal. The output clock signal has a frequency equal to a buffered clock signal frequency, with no skipped clock edges, when the clock slip signal does not change logic levels. Alternatively, the output clock signal frequency is equal to the buffered clock signal frequency, with a skipped clock edge, when the clock slip signal changes logic levels.

The modulus count has an average frequency equal to the clock signal frequency divided by N when the output clock signal matches the buffered clock signal (NF). Alternatively, the modulus count has an average frequency equal to the clock signal frequency divided by N.5 when the output clock signal skips a buffered clock signal edge.

Additional details of the above-described system, and a method for generating an output clock used for N.5 modulus division, are provided below.

BRIEF DESCRIPTION OF THE DRAWINGS

FIG. 2 is a schematic diagram of a simplified modulus counter, which divides by N in FIG. 1 (prior art).

FIG. 3 is a schematic block diagram depicting a system for generating an output clock used for N.5 modulus division.

FIG. 7 is a logic timing diagram depicting the signals at various nodes of FIG. 4 when N=3.5.

FIG. 8 is a flowchart illustrating a method for generating an output clock used for N.5 modulus division.

DETAILED DESCRIPTION

FIG. 3 is a schematic block diagram depicting a system for generating an output clock used for N.5 modulus division. The system 300 comprises an edge-slip circuit 302 having an input on line 304 to accept a modulus count, an input on line 306 to accept a divisor select signal, an input on line 308 to accept a clock signal having a frequency greater than a modulus count frequency, an input on line 310 to accept an output clock signal, and an output on line 312 to supply a clock slip signal (NE). An exclusive-or (XOR) 314 has an input on line 316 to accept a buffered clock signal (NF) and an input on line 312 to accept the clock slip signal (NE). The XOR 314 has an output on line 310 to supply the output clock signal. The output clock signal has a frequency equal to a buffered clock signal frequency on line 316, with no skipped clock edges, when the clock slip signal does not change logic levels. The output clock signal frequency is equal to the buffered clock signal frequency, with a skipped clock edge, when the clock slip signal changes logic levels. Detailed timing diagrams are presented below.

The edge-slip circuit 302 accepts the modulus count on line 304 having an average frequency equal to the clock signal frequency (on line 308) divided by N when the output clock signal on line 310 matches the buffered clock signal (NF). Alternatively, the edge-slip circuit 302 accepts a modulus count on line 304 having an average frequency equal to the clock signal frequency on line 308 divided by N.5 when the output clock signal on line 310 skips a buffered clock signal edge. It should be noted that the N.5 ratio is responsive to the frequency of skipped clock edges. That is, the edge-slip circuit must provide the proper relationship between non-slipped and slipped clock edges.

Figure 1:
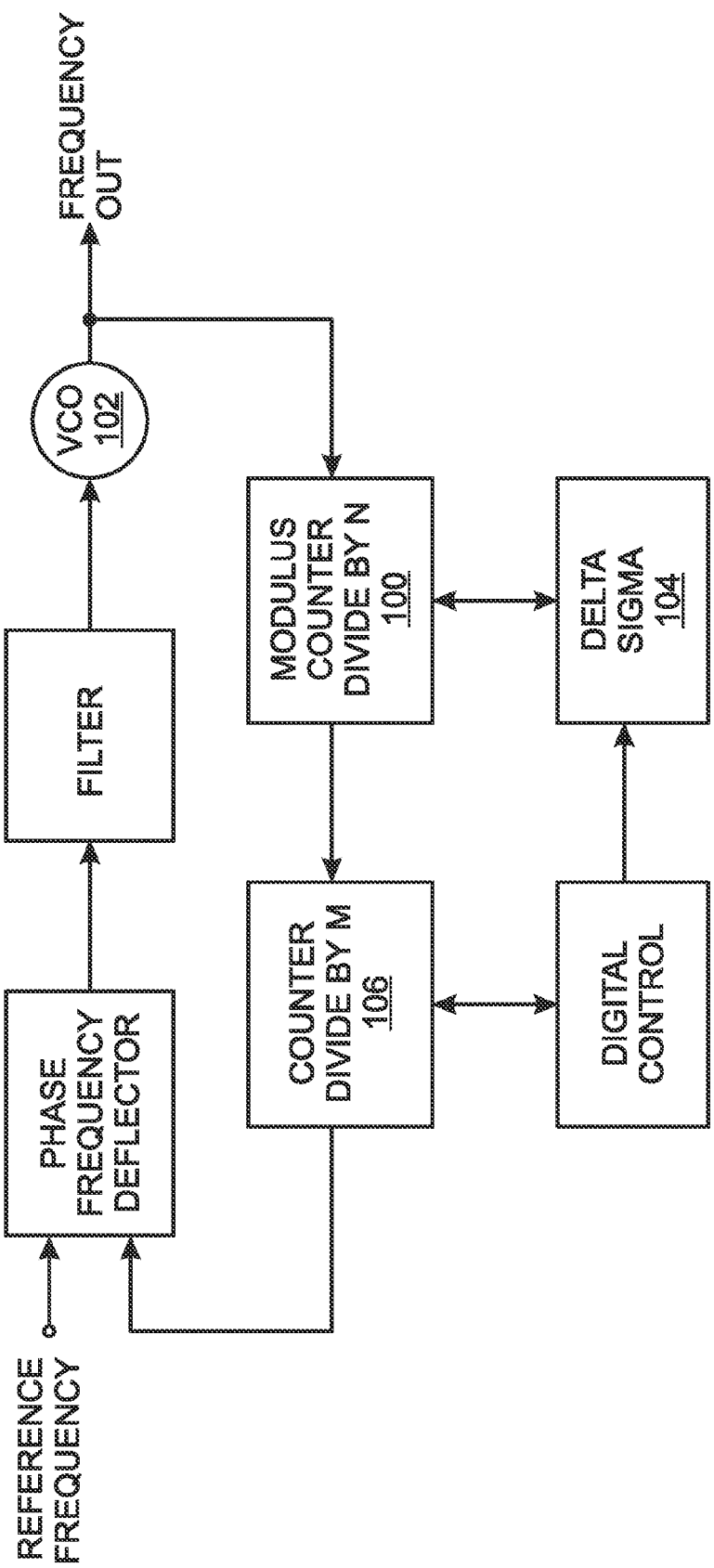
FIG. 1 is a schematic diagram of a phase-locked loop (prior art).
Figure 4:
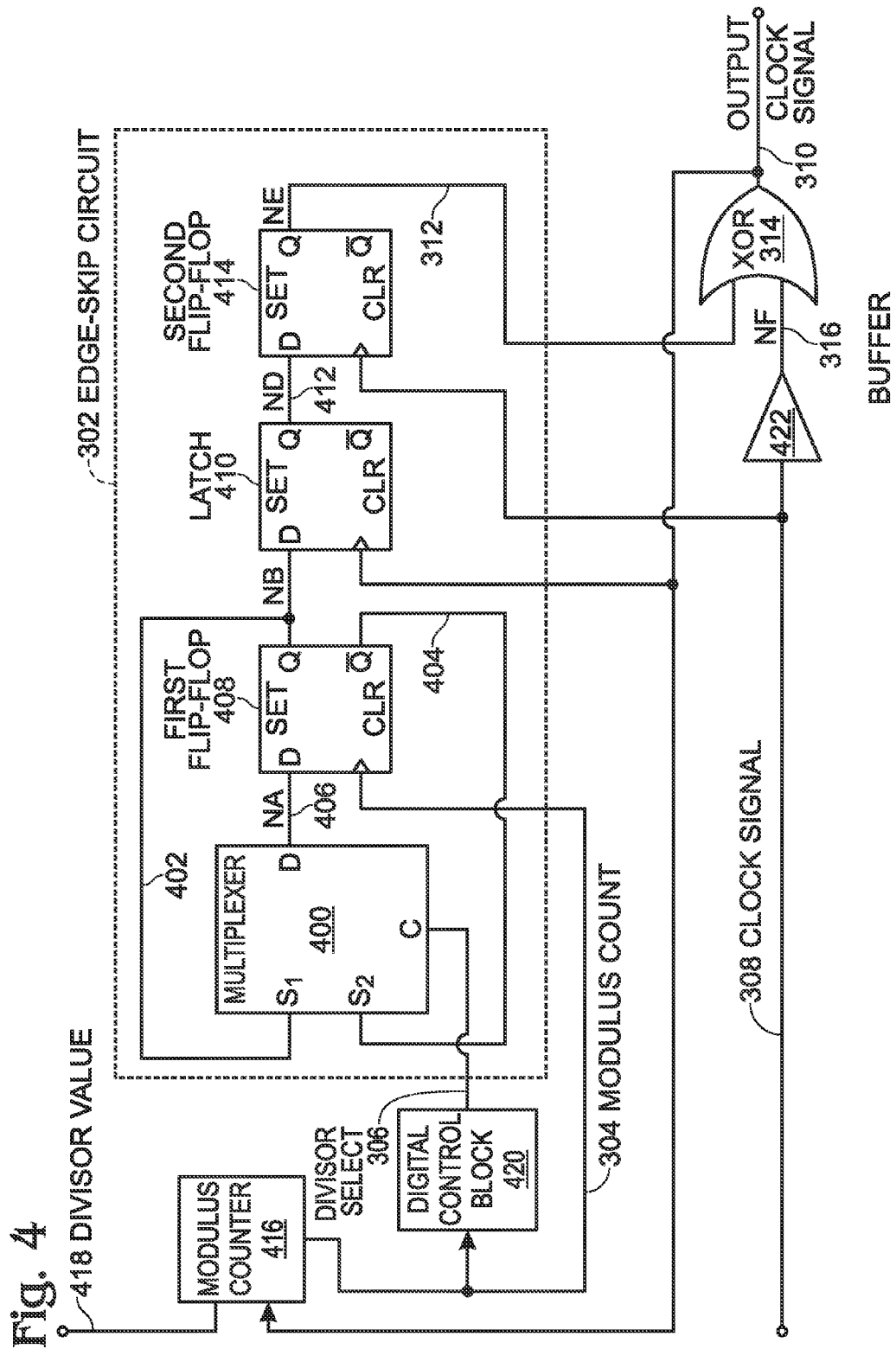
FIG. 4 is a schematic diagram depicting the edge-skip circuit of FIG. 3 in greater detail.

FIG. 4 is a schematic diagram depicting the edge-skip circuit of FIG. 3 in greater detail. The edge-slip circuit 302 comprises a multiplexer 404, having a first input (S1) on line 402, a second input (S2) on line 404, a control input (C) to accept the divisor select signal on line 306, and an output (NA) on line 406. A first flip-flop 408 has a clock input to accept the modulus count on line 304, a signal input connected to the multiplexer output (NA) on line 406, a non-inverting output (NB) connected to the multiplexer first input (S1) on line 402, and an inverting output (NC) connected to the multiplexer second input (52) on line 404.

A latch 410 has a clock input to accept the output clock signal on line 310, a signal input connected to the first flip-flop non-inverting output (NB) on line 402, and a non-inverting output (ND) on line 412. A second flip-flop 414 has a clock input to accept the clock signal on line 308, a signal input connected to the latch output (ND) on line 412, and a non-inverting output (NE) to supply the clock skip signal on line 312.

When the multiplexer 400 accepts a divisor select signal on line 306 selecting the multiplexer second input (S2) on line 404, the second flip-flop 414 supplies a clock slip signal on line 312 with a change of logic level in response to the multiplexer second input being selected. In contrast, when the multiplexer 400 accepts a divisor select signal on line 306 selecting the multiplexer first input (S1) on line 402, the second flip-flop 414 supplies a clock slip signal on line 312 with no change of logic level in response to the multiplexer first input being selected.

A modulus counter 416 has a control input on line 418 to accept a divisor value, an input to accept the output clock signal on line 310, and an output to supply the modulus count on line 304. A digital control block 420 has an input to accept the modulus count on line 304 and an output to supply the divisor select signal on line 306. The digital control block 420 has the function of determining when the modulus counter 416 should generate the N.5 modulus count. When the N.5 modulus count is needed, the digital control block generates a divisor select signal (306), which causes a clock edge slip in output clock signal (310). It is the clock edge slip that permits the N.5 count to occur without changing any other parameters or variables in the modulus counter 416. The digital control block may be enabled in hardware, enabled in software as a sequence of software instructions stored in a non-transitory memory and executed by a processor, or enabled partially in hardware and partially in software. Ultimately, it is the digital control block that determines the divisor signal timing, which in turn, determines the relationship between the non-slipped and slipped clock edges.

In one aspect, a buffer 422 has an input on line 308 to accept the clock signal and an output on line 316 to supply the buffered clock signal (NF).

Functional Description

The circuits of FIGS. 3 and 4 can be thought of as having three input signals. The divisor select signal on line 306 is a signal indicating if division by an integer (N), or by N.5 is desired. The modulus count is the frequency output of the modulus counter 416 supplying the modulus count of N or N.5. The clock signal on line 308 is typically supplied by a VCO (not shown). The output clock signal on line 310 is the original clock signal, buffered, and with pauses in it, if the divide by N.5 operation is desired.

The circuit has three sections: the pulse generator, the retimer, and the XOR. The pulse generator consists of the multiplexer 400 and first flip-flop 408. Note that the first flip-flop 408 has positive and negative outputs, NB and NC. These outputs are tied to the multiplexor's inputs S1 and S2, while the output of the multiplexor, NA, is tied to the input of the first flip-flop 408. The first flip-flop 408 is triggered by the modulus count on line 304, so the state of this circuit can change at most once per modulus count cycle. The multiplexor 400 is controlled by the divisor select signal on line 306. When a modulus count of N (N.0) is desired. NB is connected to the first flip-flop's input (406) so the flip-flop doesn't change state. If the divisor select signal triggers the N.5 modulus count, then NC is tied to the first flip flop's input so that the flip-flop changes state. Therefore, this circuit changes states only when the divisor select signal is set to N.5 state and there is a transition on the modulus count.

The retimer consists of the latch 410, the second flip-flop 414, and the buffer 422. Retiming is typically required for high speed logic. The output clock signal on line 310 drives the modulus counter 416 so the modulus counter output on line 304 is delayed by at least a clock-to-Q propagation delay. Then the modulus count signal on line 304 clocks the first flip-flop 408, so that NB on line 402 now is delayed from the original output clock signal on line 310 by at least two clock-to-Q delays. The latch 410 is also driven by the output clock signal on line 310, so ND on line 412 now has only a single clock-to-Q delay. Note that the second flip-flop 414 is clocked by the clock signal on line 308, so NE on line 312 is delayed by a clock-to-Q delay. The buffer 422 also delays the clock signal by a similar amount, creating the buffered clock signal NF on line 316. As a result, both NF on line 316 and NE on line 312 are delayed approximately the same.

The final part of the circuit is the XOR 314. The exclusive-OR gate is a well-known circuit whose operation can be described as a buffer that will invert or not invert one input depending on the state of the other input. In this application, NE on line 312 is used as the control input, causing the exclusive-OR gate 314 to invert or not invert its other input, the buffered clock signal NF on line 316.

The operation of the circuit is as follows. The clock signal on line 308 passes through the buffer 422 and the XOR 314, and appears on the output clock signal line 310, either inverted or not inverted. If the edge-slip circuit 302 is in the N.0 mode, the first flip-flop 408 remains in its current state, so no pulse is generated. As a result, the latch 410 and the second flip-flop 414 also do not change state, resulting in a static signal on line 312 (NE). Therefore, the output clock signal on line 310 remains stable, either inverted or not inverted. But when the edge-slip circuit 302 is set to the N.5 mode, for each output clock pulse on line 310, NB (line 402) changes state. This transition passes through the latch 410 and the second flip-flop 414, driving NE (line 312) of the XOR 314. The result is that the output clock signal on line 310 pauses for half a clock cycle, thereby stretching out the divide by N modulus counter by 0.5 clock pulses. Below is a logic table showing the above-described operations.

TABLE 1

| NE (312) | NF (316) | Output Clock Signal (310) |
|---|---|---|
| 0 | 0 | 0 |
| 0 | 1 | 1 |
| 0 | 0 | 0 |
| 0 | 1 | 1 |
| 0 | 0 | 0 |
| 1 NE changes state | 1 | 0 Note lack of transition here |
| 1 | 0 | 1 |
| 1 | 1 | 0 |
| 1 | 0 | 1 |
| 0 NE changes state | 1 | 1 Note lack of transition here |
| 0 | 0 | 0 |
| 0 | 1 | 1 |

As can be seen in the Table, each time NE changes state, the output clock signal is delayed by half a clock pulse.

Figure 5:
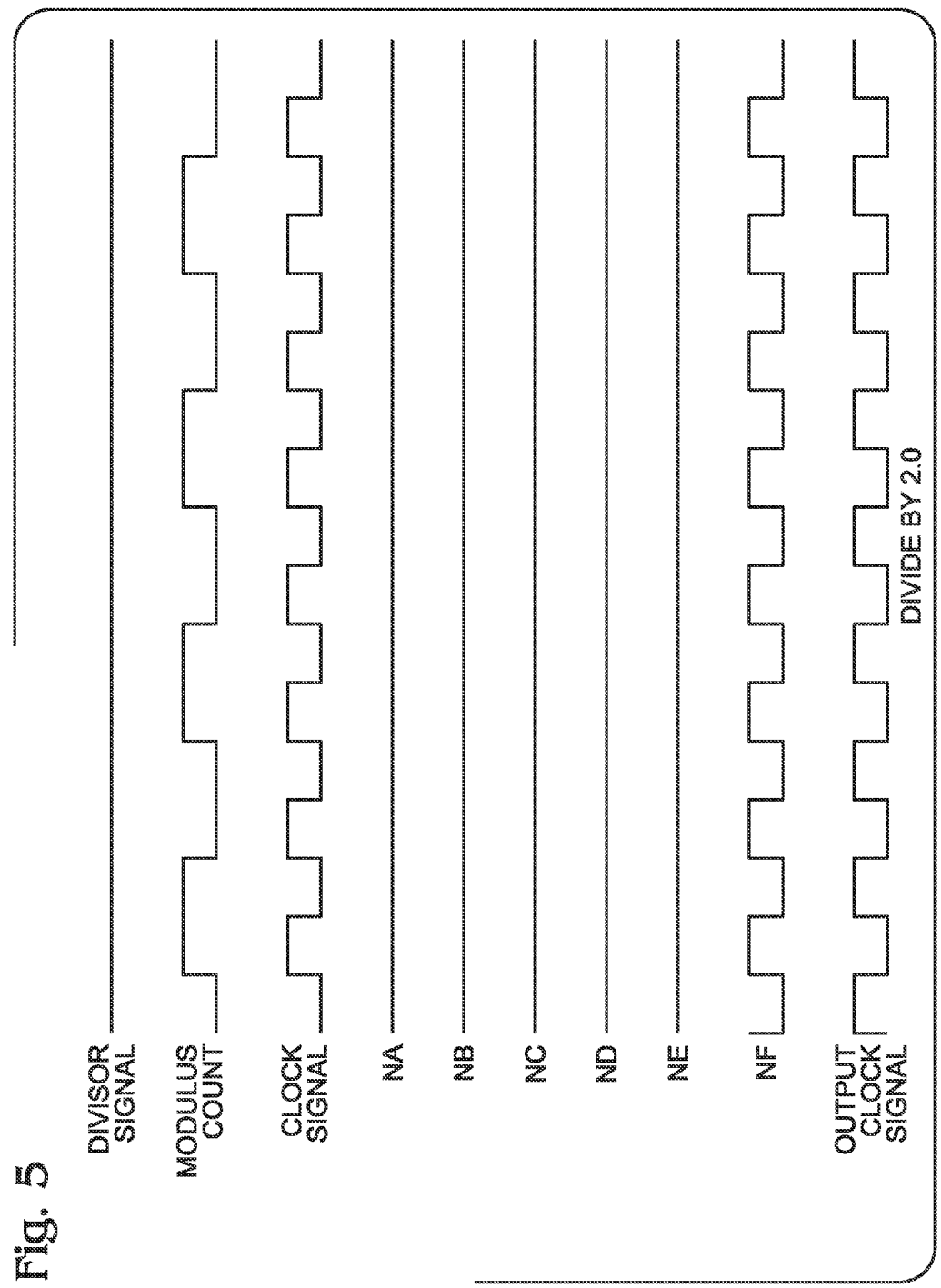
FIG. 5 is a logic timing diagram depicting the signals at various nodes of FIG. 4 when N=2.

FIG. 5 is a logic timing diagram depicting the signals at various nodes of FIG. 4 when N=2.

Figure 6:
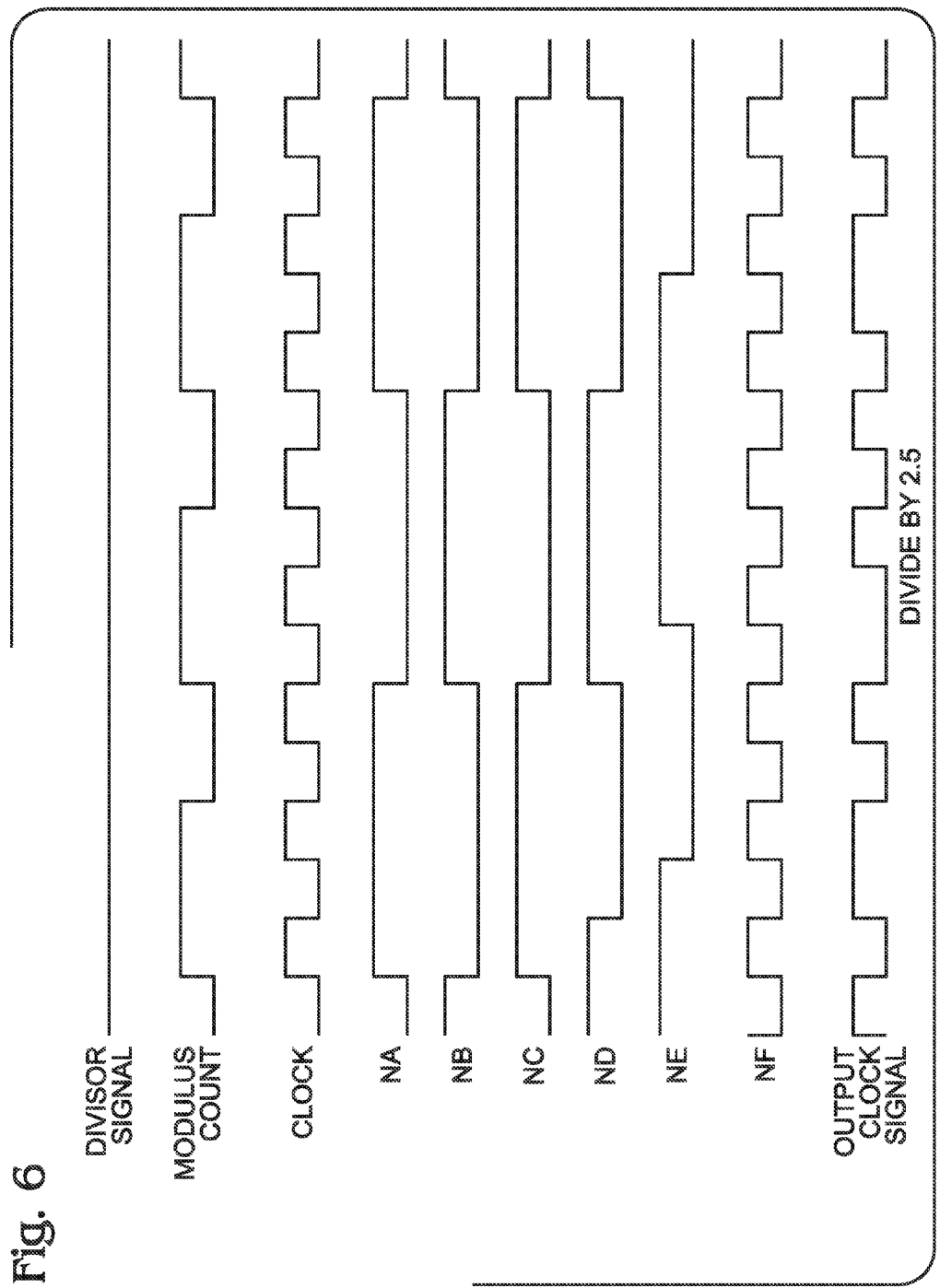
FIG. 6 is a logic timing diagram depicting the signals at various nodes of FIG. 4 when N=2.5.

FIG. 6 is a logic timing diagram depicting the signals at various nodes of FIG. 4 when N=2.5.

FIG. 7 is a logic timing diagram depicting the signals at various nodes of FIG. 4 when N=3.5.

FIG. 8 is a flowchart illustrating a method for generating an output clock used for N.5 modulus division. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. Generally however, the method follows the numeric order of the depicted steps. The method starts at Step 800.

Step 802 accepts a modulus count having a frequency. Step 804 accepts a divisor select signal. Step 806 accepts a clock signal having a frequency greater than the modulus count frequency. Step 808 accepts an output clock signal. Step 810 generates a digital clock slip signal (NE) in response to the modulus count, the divisor select signal, the output clock signal, and the clock signal. Step 812 supplies the output clock signal. Step 812c supplies the output clock signal having a frequency equal to the clock signal, with no skipped clock edge, when the clock slip signal (NE) does not change logic levels. Step 812d supplies the output clock signal having a frequency equal to the clock signal, with a skipped clock edge, when the clock slip signal changes logic levels. Step 814 generates the modulus count.

In one aspect, accepting the modulus count in Step 802 includes substeps. Step 802a accepts a modulus count of the clock signal frequency divided by N in response to the output clock signal having no skipped clock edges. Alternatively, Step 802b accepts a modulus count of the clock signal frequency divided by N.5 in response to the output clock signal having a skipped clock edge.

In another aspect, supplying the output clock signal in Step 812 includes further substeps. Step 812a buffers the clock signal, to supply a buffered clock signal (NF). Step 812b performs an Exclusive-OR operation on the input buffered clock signal and input clock slip signal (NE).

In one aspect, Step 801 provides an edge-slip circuit including a multiplexer having a first input (S1), a second input (S2), a control input (C), and an output (NA). The edge-slip circuit also includes a first flip-flop having a clock input, a signal input connected to NA, a non-inverting output (NB) connected to S1, and an inverting output (NC) connected to S2. A latch has a clock input, a signal input connected to NB, and an output (ND). A second flip-flop has a clock input, a signal input connected to ND, and an output to supply the clock slip signal (NE), see FIG. 4. Then, accepting the modulus count in Step 802 includes the first flip-flop clock input accepting the modulus count. Accepting the divisor select signal in Step 804 includes the multiplexer control input accepting the divisor select signal. A digital control block may be used to supply the divisor select signal in response to the modulus count. Accepting the clock signal in Step 806 includes the second flip-flop clock input accepting the clock signal, and accepting the output clock signal in Step 808 includes the latch clock input accepting the output clock signal.

In one aspect, supplying the output clock signal with no skipped clock edge in Step 812c includes the multiplexer accepting a divisor signal selecting the multiplexer first input. Supplying the output clock signal with a skipped clock edge in Step 812d includes the multiplexer accepting a divisor signal selecting the multiplexer second input.

A system and method have been provided for generating an output clock used for N.5 modulus division. Examples of particular logic waveforms, timing relationships, and logic circuits have been presented to illustrate the invention. However, the invention is not limited to merely these examples. Other variations and embodiments of the invention will occur to those skilled in the art.

I claim:

1. A system for generating an output clock used for N.5 modulus division, the system comprising:

an edge-slip circuit having an input to accept a modulus count, an input to accept a divisor select signal, an input to accept a clock signal having a frequency greater than a modulus count frequency, an input to accept an output clock signal, and an output to supply a clock slip signal (NE);

an exclusive-or (XOR) having an input to accept a buffered clock signal (NF), an input to accept the clock slip signal (NE), and an output to supply the output clock signal as follows:

the output clock signal having a frequency equal to a buffered clock signal frequency, with no skipped clock edges, when the clock slip signal does not change logic levels; and, the output clock signal frequency equal to the buffered clock signal frequency, with a skipped clock edge, when the clock slip signal changes logic levels.

2. The system of claim 1 wherein the edge-slip circuit accepts the modulus count having an average frequency equal to the clock signal frequency divided by N when the output clock signal matches the buffered clock signal (NF); and, wherein the edge-slip circuit accepts the modulus count having an average frequency equal to the clock signal frequency divided by N.5 when the output clock signal skips a buffered clock signal edge.

3. The system of claim 1 wherein the edge-slip circuit comprises:

a multiplexer having a first input (S1), a second input (S2), a control input (C) to accept the divisor select signal, and an output (NA);

a first flip-flop having a clock input to accept the modulus count, a signal input connected to the multiplexer output (NA), a non-inverting output (NB) connected to the multiplexer first input (S1), and an inverting output (NC) connected to the multiplexer second input (S2);

a latch having a clock input to accept the output clock signal, a signal input connected to the first flip-flop non-inverting output (NB), and a non-inverting output (ND); and, a second flip-flop having a clock input to accept the clock signal, a signal input connected to the latch output (ND), and a non-inverting output (NE) to supply the clock skip signal.

4. The system of claim 3 wherein the multiplexer accepts the divisor select signal selecting the multiplexer second input; and, wherein the second flip-flop supplies a clock slip signal change of logic level in response to the multiplexer second input being selected.

5. The system of claim 3 wherein the multiplexer accepts the divisor select signal selecting the multiplexer first input; and, wherein the second flip-flop supplies a clock slip signal with no change of logic level in response to the multiplexer first input being selected.

6. The system of claim 1 further comprising: a modulus counter having a control input to accept a divisor value, an input to accept the output clock signal, and an output to supply the modulus count; and, a digital control block having an input to accept the modulus count and an output to supply the divisor select signal.

7. The system of claim 1 further comprising:

a buffer having an input to accept the clock signal and an output to supply the buffered clock signal (NF).

8. A method for generating an output clock used for N.5 modulus division, the method comprising:

accepting a modulus count having a frequency;
accepting a divisor select signal;
accepting a clock signal having a frequency greater than the modulus count frequency;
accepting an output clock signal;
generating a digital clock slip signal (NE) in response to the modulus count, the divisor select signal, the output clock signal, and the clock signal;
supplying the output clock signal having a frequency equal to the clock signal, with no skipped clock edge, when the clock slip signal (NE) does not change logic levels; and,
supplying the output clock signal having a frequency equal to the clock signal, with a skipped clock edge, when the clock slip signal changes logic levels.

9. The method of claim 8 wherein accepting the modulus count includes:

accepting a modulus count of the clock signal frequency divided by N in response to the output clock signal having no skipped clock edges; and accepting a modulus count of the clock signal frequency divided by N.5 in response to the output clock signal having a skipped clock edge.

10. The method of claim 8 wherein supplying the output clock signal includes:

buffering the clock signal, to supply a buffered clock signal (NF); and,
performing an Exclusive-OR (XOR) operation on the input buffered clock signal with the input clock slip signal (NE).

11. The method of claim 10 further comprising:

providing an edge-slip circuit including:
a multiplexer having a first input (S1), a second input (S2), a control input (C), and an output (NA);
a first flip-flop having a clock, input, a signal input connected to NA, a non-inverting output (NB) connected to S1, and an inverting output (NC) connected to S2;
a latch having a clock input, a signal input connected to NB, and an output (ND);
a second flip-flop having a clock input, a signal input connected to ND, and an output to supply the clock slip signal (NE);
wherein accepting the modulus count includes the first flip-flop clock input accepting the modulus count;
wherein accepting the divisor select signal includes the multiplexer control input accepting the divisor select signal;
wherein accepting the clock signal includes the second flip-flop clock input accepting the clock signal; and,
wherein accepting the output clock signal includes the latch clock input accepting the output clock signal.

12. The method of claim 11 wherein supplying the output clock signal with no skipped clock edge includes the multiplexer accepting a divisor signal selecting the multiplexer first input.

13. The method of claim 11 wherein supplying the output clock signal with a skipped clock edge includes the multiplexer accepting a divisor signal selecting the multiplexer second input.

14. The method of claim 11 wherein accepting the divisor select signal includes a digital control block having an output to supply the divisor select signal in response to the modulus count.

* * * * *